(12) United States Patent
Nakaoka

(10) Patent No.: US 8,295,113 B2
(45) Date of Patent: Oct. 23, 2012

(54) SEMICONDUCTOR DEVICE

(75) Inventor: Yuji Nakaoka, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 203 days.

(21) Appl. No.: 12/913,158

(22) Filed: Oct. 27, 2010

(65) Prior Publication Data

US 2011/0103123 A1 May 5, 2011

(30) Foreign Application Priority Data

Oct. 30, 2009 (JP) ................. 2009-250394

(51) Int. Cl.
*G11C 7/02* (2006.01)

(52) U.S. Cl. ............. 365/207; 365/196; 365/189.04; 365/210.13; 365/189.17; 365/189.19

(58) Field of Classification Search ............. 365/207, 365/196, 210.13, 189.17, 189.04, 189.011
See application file for complete search history.

(56) References Cited

U.S. PATENT DOCUMENTS 5,657,286 A 8/1997 Arimoto
RE40,356 E * 6/2008 Takahashi et al. ....... 365/230.03

FOREIGN PATENT DOCUMENTS

JP 7-334985 12/1995

* cited by examiner

*Primary Examiner* — Thong Q Le
(74) *Attorney, Agent, or Firm* — Morrison & Foerster LLP

(57) ABSTRACT

Disclosed is a semiconductor device including: a first switch controlling connection between a first data line pair a second data line pair; a first amplifier connected to the first data line pair; a second switch controlling the connection between the second data line pair and a third data line pair; a second amplifier amplifying data on the second data line pair and delivering the amplified data to the third data line pair; a third amplifier connected to the third data line pair; and a switch control circuit controlling the second switch. Based upon a first control signal that controls precharging and equalization of the first data line pair, the switch control circuit renders the second switch conductive when precharging and equalization of the first data line pair is not carried out, and renders the second switch non-conductive when precharging and equalization of the first data line pair is carried out.

20 Claims, 11 Drawing Sheets

SEMICONDUCTOR DEVICE

REFERENCE TO RELATED APPLICATION

This application is based upon and claims the benefit of the priority of Japanese patent application No. 2009-250394, filed on Oct. 30, 2009, the disclosure of which is incorporated herein in its entirety by reference thereto.

TECHNICAL FIELD

This invention relates to a semiconductor device and, more particularly, to a semiconductor device including a switch control function between hierarchical data lines.

BACKGROUND

A hierarchical data line scheme (also referred to as a "hierarchical IO scheme") is used as an input/output data transfer system in a memory array of a semiconductor device such as a DRAM (Dynamic Random-Access Memory). By way of example, a hierarchical data line scheme has a first data line such as a bit line, a second data line [e.g., a local input/output line (LIO line)] connected to the first data line, and a third data line [main input/output line (MIO line)] connected to the second data line. A plurality of bit lines are connected to the local input/output line (LIO line), and a plurality of local input/output lines (LIO lines) are connected to the main input/output line (MIO line) via switches.

FIG. 1 is a block diagram illustrating the general configuration of a DRAM device. It should be noted that FIG. 1 also schematically illustrates an example of a hierarchical data line structure comprising a bit line (BL), a local input/output line (LIO line) and a main input/output line (MIO line). As shown in FIG. 1, the DRAM device includes a memory array 1; an X decoder and X timing generating circuit 2; a Y decoder and Y timing generating circuit 3; a decoder control circuit 4; a DLL (Delay-Locked Loop) 9; a data latch circuit 5; an input/output interface 6; an internal clock (CLK) generating circuit 7; and a control signal generating circuit 8. The memory array 1 has banks 0 to m, and each bank has memory mats 1, 2 and 3. It goes without saying that the bank configuration and memory mat configuration within each bank are not limited to the illustrated configurations. The control signal generating circuit 8, which has a command decoder (not shown) to which a command signal [/CS (chip select), /RAS (row address strobe), /CAS (column address strobe) and /WE (write-enable)] is input, and which decodes the command, generates a control signal in accordance with the result of decoding the command and outputs the control signal to the X decoder and X timing generating circuit 2, Y decoder and Y timing generating circuit 3 and decoder control circuit 4. It should be noted that the "/" symbol preceding each signal name indicates that the signal is in the activated state when at the low level.

The row address of an input address signal (ADD) is decoded by the X decoder 2, a main word line (not shown) is activated by a main word driver (not shown), and a sub word line (SWL) is selected by a sub word driver (SWD) connected to the activated main word line. If the sub word line (SWL) attains the high level, held data is read out to the bit line (BL) from a memory cell (MC) connected to the sub word line (SWL) and the data is amplified by a sense amplifier. It should be noted that the column address of the address (ADD) is decoded by the Y decoder (column decoder) 3, the selected column select signal is activated and the bit line (BL) is connected to the local input/output line (LIO line). The data on the selected bit line (BL) is amplified by a sense amplifier, the amplified data is transferred to the local input/output line (LIO line) via a column switch, is transferred to the main input/output line (MIO line) via a switch 10 (sub amp) at the intersection of the main input/output line (MIO line) and local input/output line (LIO line), is transferred to the data latch circuit 5 and input/output interface 6 and is output externally from a DQ pin (DQ terminal). There are a plurality of the DQ pins, which are so-called multiple I/O terminals. Read data that is read out to the plurality of MIO lines is subjected to a parallel-to-serial conversion and is output serially from the DQ terminal.

When data is input externally, a data strobe signal DQS, /DQS becomes a trigger signal for latching data. A data mask signal DM is a control signal for masking data. If the data mask signal is set high at the same time that data is input, the writing of this data to a memory cell is masked (inhibited) and writing does not take place. The data mask signal DM is applied to an external terminal of the semiconductor device. There are a plurality of these terminals for data mask signals DM. Each data mask signal DM is associated with a group among a plurality of groups constituted by a corresponding plurality of DQ terminals.

In a case where data is written to a memory cell, the data mask signal DM is set low, the data is input from a DQ pin and the data is transferred from the input/output interface 6 to the data latch circuit 5. It should be noted that multiple-bit data (write data) that has been input serially from the DQ terminal is subjected to a serial-to-parallel conversion, and each item of bit data is transferred as write data to the sense amplifier of this bit line (BL) via the MIO line, intersection switch 10, LIO line and column switch of the selected bit line (BL). The sense amplifier drives the bit line (BL) in accordance with the write data, writes the data to the memory cell which is connected to this bit line (BL) and connected to the selected word line.

FIG. 2 is a diagram illustrating an example of the typical configuration of a sense amplifier. A portion of the bit line system of a shared-type sense amplifier circuit (SA) is illustrated in FIG. 2. A word line is driven by a sub word driver circuit 14. A memory cell includes an nMOS transistor including a gate electrode connected to the word line, and a drain or source connected to a bit line (BLT); and a capacitor Cs including a first end connected to the source or drain of the nMOS transistor and a second end connected to a power supply (plate electrode). Although not limited thereto, the bit line structure of FIG. 2 is assumed to be that of a folded bit line in which memory cell MC connected to sub word line SWL is connected to bit line BLT, and a memory cell connected to a neighboring sub word line (not shown) is connected to bit line BLN. A sense amplifier (SA circuit) connected across the lines of the bit line pair (BLT/BLN) includes a pMOS transistor pair including sources commonly connected to a PCS line, and cross-connected gates and drains; and an nMOS transistor pair including sources commonly connected to an NCS line, and cross-connected gates and drains. The drains of the pMOS transistor pair are connected to respective ones of the drains of the nMOS transistor pair.

In FIG. 2, the arrangement is such that bit line pair (BLT/BLN) of memory mat 0 (11) illustrated at the top of the drawing and bit line pair (BLT/BLN) of memory mat 1 (13) illustrated at the bottom of the drawing share sense amplifier (SA) 12 placed between them. A pass transistor (nMOS transistor) controlled to be conductive or non-conductive by control signal SHRB0 is provided between the sense amplifier circuit (SA circuit) and the bit line pair on the side of memory mat 0 (11), and a pass transistor (nMOS transistor) controlled to be conductive or non-conductive by control signal SHRB1 is provided between the sense amplifier (SA) and the bit line pair on the side of memory mat 1 (13). It should be noted that the terms "conductive" and "non-conductive" mean electrical operations and will have the same meaning in the description that follows.

Bit line pair BLT/BLN on the side of memory mat 0 (11) is provided with a circuit including three nMOS transistors whose gates are connected to control signal BLEQT0 so as to be controlled to be conductive or non-conductive. When these nMOS transistors are conductive, the circuit precharges bit line pair BLT/BLN from a precharge power supply and equalizes bit line pair BLT/BLN of memory mat 0 (11). It should be noted that the term "precharge" indicates initializing a succeeding operation following the end of the preceding operation and will have the same meaning in the description that follows.

Similarly, bit line pair BLT/BLN on the side of memory mat 1 (13) is provided with a circuit including three nMOS transistors whose gates are connected to control signal BLEQT1 so as to be controlled to be conductive or non-conductive. When these nMOS transistors are conductive, the circuit precharges bit line pair BLT/BLN from a precharge power supply and equalizes bit line pair BLT/BLN of memory mat 1 (13). Furthermore, connection nodes between the sense amplifier (SA circuit) and bit line pair are connected to an input/output line pair (I/O) via a column switch pair controlled to be conductive or non-conductive by high/low of column-select signal CSL. The input/output line pair (I/O) corresponds to LIO in FIG. 1 and one pair is provided in correspondence with each of memory mats 0 and 1.

A pMOS transistor 18 including a gate supplied with a control signal RSAEPIT is provided between VARY power supply line of the memory array and PCS, and an nMOS transistor 20 including a gate supplied with a control signal RSAENT is provided between VSSSA power supply line and NCS. Provided between PCS and NCS are a precharge and equalizing circuit 19 which is rendered conductive (turned on) to precharge PCS and NCS and to equalize PCS and NCS when a control signal EQCS is at a high level.

FIG. 3 is a diagram schematically illustrating the hierarchical data line structure (hierarchical IO scheme) within the memory array 1 of FIG. 1. In FIG. 3, RWBUS is a wiring for transferring data within the chip. A bus driver <k> 301 is a kth bus driver circuit connected to RWBUS. Connected to the input of bus driver <k> 301 is the output of a main data amplifier circuit (MA)<k> 302 for amplifying data on MIO lines (complementary MIOT, MION).

The input to the main data amplifier circuit (MA)<k> 302 is differentially connected to MIOT <k> and MION <k>, which are a kth MIO line pair within the array, and the output thereof is connected to a driver (BUSD) <k> 301. Write data from the RWBUS is input via a receiver 306 to a write amplifier (WA) 305, which drives MIOT <k>, MION <k>. When data is written, the write amplifier (WA) 305 receives the output from the receiver <k> 306 and outputs a differential signal to the MIO line pair MIOT <k>, MION <k>. When data is read, the main data amplifier circuit (MA) <k> 302 differentially receives signals from the MIO line pair MIOT <k> and MION <k>, converts these to a CMOS level and outputs the result to the bus driver (BUSD)<k> 301. When data is read out, the write amplifier (WA) 305 is rendered non-conductive and its output is set to a high impedance state.

Connected to the MIO line pair (MIOT <k>, MION <k>) are (m+1)-number of SWC circuits 303 (SWC <0> to SWC <m>). The SWC circuits correspond to the switches 10 at the intersections of the MIO line pairs and LIO line pairs in FIG. 1. In the example of FIG. 1, each MIO line pair is provided with SWC<0>, SWC<1> and SWC<2> in correspondence with the memory mat columns 1, 2 and 3. The SWC<0> is connected to a LIO line pair LIOT<0> and LION<0>), and the SWC<1> is connected to LIO line pair LIOT<1> and LION<1>. Similarly, the SWC<m> is connected to LIO line pair LIOT<m> and LION<m>. Selected from among the SWC<0> to SWC<m> is a SWC circuit corresponding to LIO line pairs connected to sense amplifiers SA<0>, SA<1>, • • • and SA<n> connected to a bit line of the selected memory mat. The other SWC circuits are not selected.

Although this imposes no restriction upon the invention, when data is written, SWC<i> (where i is an integer and i=0 to m holds) transfers write data on MIO line pair (MIOT<i>, MION<i>) to LIO line pair (LIOT<i>, LION<i>) via a transfer gate (also referred to as a "pass transistor") (not shown). When data is read, SWC<i> receives, at a sub-amplifier (read amplifier) (not shown), read data, which has been transferred from the LIO line pair (LIOT<i>, LION<i>), from the sense amplifier of the selected bit line, and outputs the data to the MIO line pair (MIOT<i>, MION<i>). The LIO line pair has its connection to (n+1)-number sense amplifiers SA<0> to SA<n> controlled by (n+1)-number of column-select signals CSL<0> to CSL<n>, and the selected one sense amplifier SA is connected to the LIO line pair.

As an example of a semiconductor storage device including the above-described hierarchical data line structure, Patent Document 1 discloses an arrangement in which an amplifier for reading is provided between a segment data line pair and a global data line pair in a hierarchical bus, with a transfer gate for writing being provided elsewhere. The transfer gate is controlled to be electrically conductive only when data is written.

[Patent Document 1]
Japanese Patent Kokai Publication No. JP-A-07-334985 and U.S. Pat. No. 5,657,286A

SUMMARY

The entire disclosure of Patent Document 1 is incorporated herein by reference thereto.

In the arrangement of the related art of FIG. 9, etc., of Patent Document 1, activation of the amplifier for reading and conduction of the transfer gate for writing are controlled by a read-related control signal and a write-related control signal, and the write and read operations are separated.

The intersections (see reference numeral 10 in FIG. 1, or see the intersections of SIO and GIO in FIG. 14 of Patent Document 1) of the MIO lines and LIO lines constituting the hierarchical data line structure are interspersed between sub-arrays. Owing to the increase in the number of and in wiring length for the control signals that control the switches placed at these intersections, chip area is increased and a large power consumption accompanies the charging and discharging of the wiring interconnects. Accordingly, a reduction in the number of control-signal wiring interconnects and power consumption is desirable.

In accordance with the present invention, there is provided a semiconductor device comprising: first to third data lines forming a hierarchical data line structure; a first switch controlling connection between the first and second data lines; a second switch controlling connection between the second and third data lines; a first amplifier connected to the first data line and amplifying data information on the first data line and holding this information; a second amplifier amplifying data on second data line and outputting the amplified data to the third data line; a third amplifier for read and a fourth amplifier for write, connected to the third data line; and a switch control circuit controlling the second switch. The switch control circuit generates a signal, which is for controlling the second switch, using a first control signal which is employed as a signal for controlling precharging of the first data line in a standby mode, in which the semiconductor device is not externally accessed, irrespective of a read mode or a write mode, instead of using a write-related special-purpose control signal for externally writing data to the first data line, and controls the second switch to be electrically conductive or non-conductive. In the present invention, the switch control circuit places the second switch in the electrically conductive state by the signal that controls the second switch, when data is transferred (written) from the third data line to the side of the second data line, and places the second switch in the electrically conductive state, in a manner similar to that at write time, using the signal that controls the second switch, when data is transferred (read) from the second data line to the third data line. In this case, the second switch operates at an impedance value, which is higher than an impedance value prevailing at write time, owing to operation of the second amplifier, and a load on the third data line is no longer visible from the side of the second data line. In the present invention, the first to third data lines may be constructed as data line pairs each of which transmits one signal as complementary signals.

According to the present invention, the reduction of the number of control signals in a memory array including a high degree of integration can be achieved. Further, a control signal that used to operate at the frequency of a write mode/read mode is caused to operate at the frequency of a standby mode/active mode. As a result, the cycle of the charge/discharge current of the control signal can be lengthened and power consumption reduced.

Still other features and advantages of the present invention will become readily apparent to those skilled in this art from the following detailed description in conjunction with the accompanying drawings wherein only exemplary embodiments of the invention are shown and described, simply by way of illustration of the best mode contemplated of carrying out this invention. As will be realized, the invention is capable of other and different embodiments, and its several details are capable of modifications in various obvious respects, all without departing from the invention. Accordingly, the drawing and description are to be regarded as illustrative in nature, and not as restrictive.

PREFERRED MODES

Figures 4A, 4B:
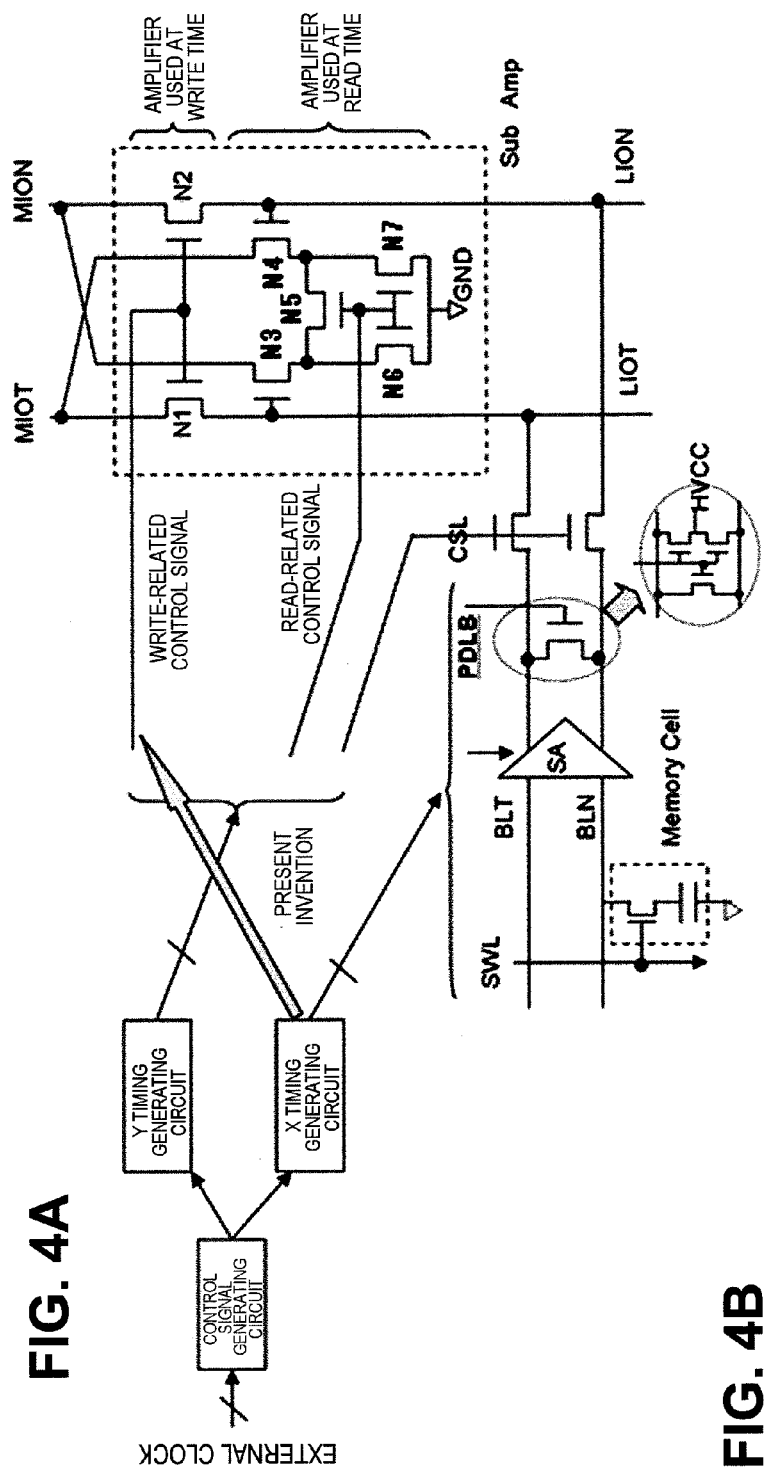
FIGS. 4A and 4B are diagrams useful in describing the present invention.

Embodiments of the present invention will be described. FIGS. 4A and 4B are diagrams useful in describing the present invention while contrasting it with the related art. In the present invention, conduction and non-conduction of a transfer gate (nMOS transistors N1 and N2 in FIG. 4A) within a switch (10 in FIG. 1) placed at the intersection of a main input/output lines (MIOT/MION) and local input/output lines (LIOT/LION) is controlled based upon an equalizing control signal (PDLB) of a bit line pair (X system). When the device is in a standby state, the equalizing control signal (PDLB) is activated and renders the transistors (N1, N2) non-conductive. When an active command is entered, the equalizing control signal (PDLB) is deactivated and causes the transistors (N1, N2) to operate. The transistors (N1 and N2) also operate at read time in addition to write time. Standby (standby mode) indicates a state in which the semiconductor device is not accessed externally. Read (the read mode) indicates a state in which information is read from a memory cell and output externally. Write (the write mode) indicates a state in which external information is written to a memory cell.

In the related art described above, the transfer gate (nMOS transistors N1 and N2) at the intersection of the hierarchical IO lines is controlled by a write-related control signal generated by a Y timing generating circuit, as illustrated in FIG. 4A. It should be noted that the control signal generating circuit, X timing generating circuit and Y timing generating circuit in FIG. 4A correspond to the control signal generating circuit 8, X timing generating circuit 2 and Y timing generating circuit 3, respectively, in FIG. 1.

As shown in FIG. 4A, a read amplifier (nMOS transistors N3 to N7) placed at the intersection of the main input/output lines (MIOT/MION) and local input/output lines (LIOT/LION) is constructed as a single-ended amplifier (direct amplifier) including transistors (nMOS transistors N3 and N4) including gates connected to the local input/output lines (LIOT/LION). The purpose of this configuration is to arrange it so that a load of the main input/output lines is not directly seen by the local input/output lines and to alleviate a driving load of the sense amplifier (SA) connected to the bit lines that drive the local input/output lines via the column switch. By virtue of such an arrangement, the local input/output lines can be driven at high speed by the sense amplifier (SA) at read time. Furthermore, the main input/output lines (MIOT/MION) can be driven at high speed by adopting an arrangement in which the read amplifier is made a single-ended amplifier and the main input/output lines (MIOT/MION) are driven with a high amplification factor (high gain ratio).

Reference will be had to FIG. 4B to compare the present invention with the related art with regard to control of the nMOS transistors N1 and N2 in FIG. 4A. In the related art, as control of the transfer gate (nMOS transistors N1 and N2) that controls the connection between the main input/output lines (MIOT/MION) and local input/output lines (LIOT/LION), the write-related control signal is set high at write time to render the nMOS transistors N1 and N2 conductive and is set low at read time to make the nMOS transistors N1 and N2 non-conductive. By contrast, in accordance with the present invention, control is exercised such that, by using the precharge control signal (X-system control signal) of the bit lines (BLT/BLN), the nMOS transistors (N1 and N2) are rendered conductive at active time and non-conductive at standby time. More specifically, in the present invention, the transfer gate (nMOS transistors N1 and N2) that controls the connection between the main input/output lines (MIOT/MION) and local input/output lines (LIOT/LION) is controlled based upon the precharge control signal of the bit lines (X system). The nMOS transistors N1 and N2 are rendered conductive at read time in addition to write time. At read time, however, when the impedance value is low, the effect of making a load of the main input/output lines not directly visible from the local input/output lines diminishes. At read time, the nMOS transistors N3 and N4 of the single-end amplifier (FIG. 4A) including a high amplification factor operate simultaneously. As a result, a source-to-drain voltage VDS of the nMOS transistors N1 and N2 is low and when VDS≦VGS−VTN holds (where VGS is a gate-to-source voltage of nMOS transistors N1 and N2 and VTN is a threshold voltage of nMOS transistors N1 and N2), they operate in the triode region (unsaturated region). The impedance value, therefore, is high. Accordingly, the load of the main input/output lines (MIOT/MION) is almost unseen from the local input/output lines (LIOT/LION).

In accordance with the present invention, as mentioned above, it is no longer necessary to control the write-related control signal, and control in the write cycle is simplified. In other words, the number of control signals can be reduced and power consumption can be reduced. Further, since the control signal that used to operate at the frequency of the write mode/read mode operates at the frequency of the standby mode/active mode, the cycle of the charge/discharge current of the control signal can be elongated and power consumption reduced.

Further, in accordance with the present invention, unlike the related art, it is unnecessary within the memory array to route the write-related control signal to the switch provided at the intersection of the main input/output lines (MIOT/MION) and local input/output lines (LIOT/LION) and it is unnecessary to charge and discharge to high potential and low potential at write time and read time. That is, by reducing the control signals that pass through the memory array, the wiring load (parasitic capacitance) is reduced and it is possible to reduce the consumption current that charges and discharges the wiring every read/write cycle.

Furthermore, in accordance with the present invention, a scheme for controlling conduction of the switch between the MIO and LIO lines using the write-related control signal is not adopted. Rather, switch conduction is controlled using a bit-line precharging signal, which belongs to an X-system control signal. As a result, it is unnecessary to perform a time adjustment for preventing a timing skew between operation timing of the write amplifier and operation timing of the switch between the MIO and LIO lines. In accordance with the present invention, various actions and effects illustrated in the embodiments are achieved in additional to the foregoing. The invention will be described below in accordance with specific embodiments. In the embodiments that follow, an example in which the present invention is applied to the semiconductor device shown in FIG. 1 will be described.

First Exemplary Embodiment

Figure 3:
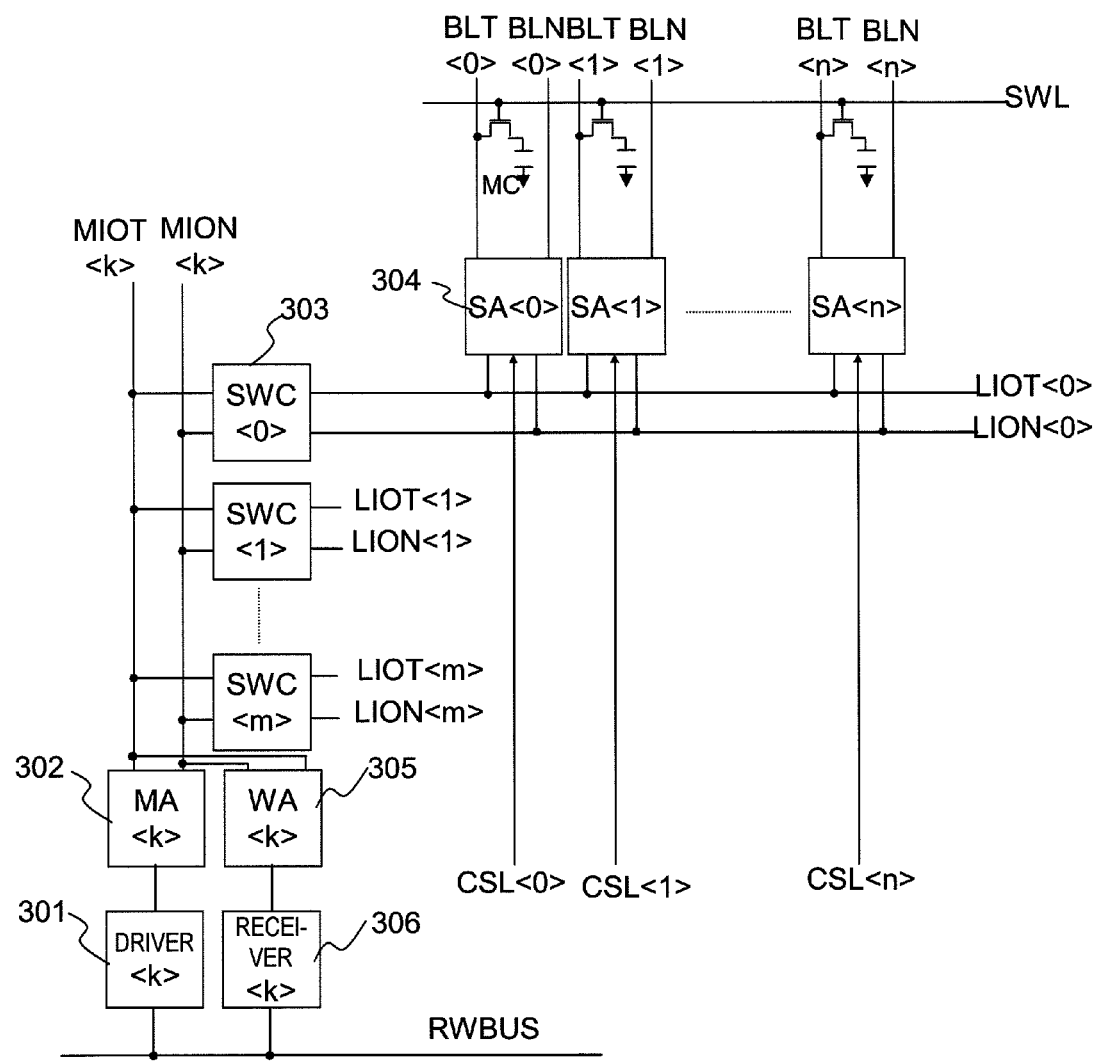
FIG. 3 is a diagram illustrating the general arrangement of input/output lines of a hierarchical scheme.
Figure 5:
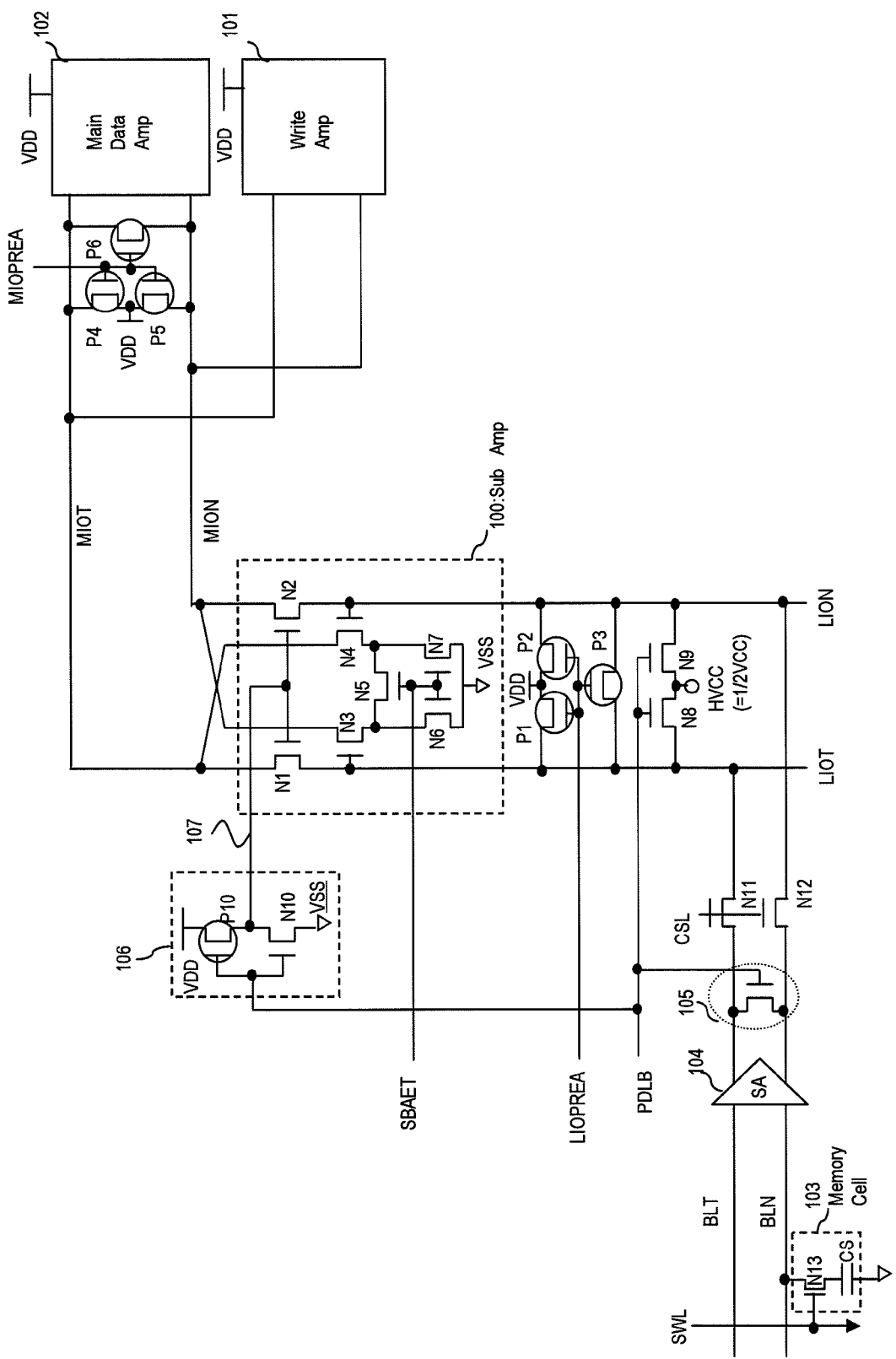
FIG. 5 is a diagram illustrating the configuration of a first exemplary embodiment of the present invention.

FIG. 5 is a diagram illustrating the configuration of a first exemplary embodiment of the present invention. In FIG. 5, a sub-amplifier (Sub Amp) 100 connected to an intersection between a main input/output line pair MIOT/MION and a local input/output line pair LIOT/LION corresponds to SWC 10 in FIG. 1 and SWC 303 in FIG. 3. It should be noted that although a plurality of local input/output line pairs LIOT/LION are connected to the main input/output line pair MIOT/MION, as illustrated in FIG. 3, only one local input/output line pair LIOT/LION connected to the main input/output line pair MIOT/MION is illustrated in FIG. 5 for the sake of simplicity.

With reference to FIG. 5, sub-amplifier 100 has nMOS transistor N1 that is connected between the main input/output line MIOT and the local input/output line LIOT and has a gate supplied with a control signal 107, and nMOS transistor N2 that is connected between the main input/output line MION and the local input/output line LION and has a gate supplied with the control signal 107.

A control signal (also referred to as a "bit line balance signal") PDLB that is for controlling precharging of the bit line pair BLT/BLN and the local input/output line pair LIOT/LION to (½) VCC (half-VCC: 0.55 V in a case where VCC is 1.1 V, by way of example) is supplied to an inverter 106. The inverter 106 outputs signal 107, which is a signal obtained by inverting the control signal PDLB. The inverter 106 comprises a pMOS transistor P10 including a source connected to a high-potential power supply VDD and an nMOS transistor N10 including a drain connected to a drain of pMOS transistor P10, a source connected to a low-potential power supply VSS, and a gate connected to a gate of pMOS transistor P10. It should be noted that the supply voltages VDD (e.g., 1.4 V) and VCC (e.g., 1.1 V) are generated by internal step-down of an external supply voltage (e.g., 1.8 V).

In this embodiment, the amplitude of the control signal PDLB is assumed to be between the supply voltage VDD (e.g. 1.4 V) and VKK (negative voltage: −0.5 V, by way of example). The reason for adopting VKK (negative voltage) is to reduce an off-leakage current (sub-threshold current) of a precharging circuit 105 (nMOS transistors N8 and N9) for precharging to HVCC, described later. In the arrangement of FIG. 5, the low-potential power supply of the inverter 106, which receives the control signal PDLB of an amplitude VDD/VKK, is VSS, and the amplitude of the output signal 107 of the inverter 106 is between the power supply voltages VDD and VSS. In a case where the low-potential power supply of the inverter 106 is made the negative-potential VKK in conformity with the low-potential side of the amplitude of control signal PDLB, the nMOS transistors N1 and N2 are required to be provided with a high withstand voltage as by thickening gate oxide films thereof, a threshold voltage of the nMOS transistors N1 and N2 is increased and the performance of the nMOS transistors is deteriorated. By contrast, in this embodiment, the low-potential power supply of inverter 106 is made VSS and, as a result, there is no need for nMOS transistors N1 and N2 to have high withstand voltages.

The sub-amplifier 100 includes nMOS transistors N3 and N4 including gates connected to the local input/output lines LIOT and LION, respectively, and drains cross-connected to the main input/output lines MION and MIOT, respectively; an nMOS transistor N5 connected between sources of the nMOS transistors N3 and N4; and nMOS transistors N6 and N7 including drains connected to the sources of the nMOS transistors N3 and N4, respectively, sources connected to the low-potential power supply VSS, and gates connected to a gate of the nMOS transistor N5 and to a control signal SBAET. The nMOS transistors N3 to N7 compose a read amplifier (sub-amplifier) within the sub-amplifier 100. It should be noted that the amplitude of the control signal SBAET is VDD/VSS. In other words, the sub-amplifier 100 includes nMOS transistors N3 and N4 (third and fourth transistors) including control terminals (gates) connected to the local input/output lines LIOT/LION, respectively, and first terminals (drains) cross-connected to the main input/output lines MION/MIOT, respectively; an nMOS transistor N5 (fifth transistor) connected between second terminals (sources) of the third and fourth transistors; and nMOS transistors N6 and N7 (sixth and seventh transistors) including drains connected to the second terminals (sources) of the third and fourth transistors, respectively, and the power supply (VSS) on the low-potential side. The control terminals (gates) of the fifth to seventh transistors are connected in common to the second control signal (control signal SBAET).

Data read out of memory cell 103 by a sense amplifier 104 is transmitted from the bit line pair BLT/BLN to the local input/output line pair LIOT/LION via column switches N11 and N12 rendered conductive by a column-select signal CSL corresponding to an externally input address (Y address). In the read amplifier (N3 to N7) of sub-amplifier 100, when data is read, the control signal SBAET is set to a high level, nMOS transistors N5, N6, and N7 are rendered conductive and the sources of nMOS transistors N3 and N4 take on a common potential. For example, when the local input/output line LIOT is at a high level, a gate-to-source voltage VGS of the nMOS transistor N3 that receives a signal on the local input/output line LIOT at its gate exceeds a threshold value VTN and the transistor N3 is rendered conductive. Electric charge on the main input/output line MION is discharged to the side of power supply VSS by a drain current of the nMOS transistor N3, and the main input/output line MION is driven to the low-level side. On the other hand, when the LIOT is at a low level (VSS), the gate-to-source voltage VGS of the nMOS transistor N3 falls below the threshold value VTN and the transistor N3 is rendered non-conductive. Similarly, the nMOS transistor N4 receives a signal on the local input/output line LION at its gate and is rendered conductive when the LION is at a high level (VDD). Electric charge on the main input/output line MIOT is discharged to the side of power supply VSS and MIOT is driven to the low level. When LION is at a low level (VSS), MIOT is rendered non-conductive.

As illustrated in FIG. 5, the local input/output line pair LIOT/LION is provided with a precharging and equalizing circuit comprising pMOS transistors P1 and P2 including sources connected to power supply VDD, drains connected to the local input/output lines LIOT and LION, respectively, and gates connected in common to a control signal LIOPREA which controls precharging of the local input/output line pair LIOT/LION; and a pMOS transistor P3 connected across the local input/output lines LIOT and LION and including a gate connected to the control signal LIOPREA. Further provided are nMOS transistors N8 and N9 connected across the local input/output lines LIOT, LION and including gates connected to the control signal PDLB. The connection node of nMOS transistors N8 and N9 is connected to HVCC [($\frac{1}{2}$)VCC≅0.55 V]. The nMOS transistors N8 and N9 precharge the local input/output line pair LIOT/LION to ($\frac{1}{2}$)VCC when the control signal PDLB is at a high level (VDD) and are rendered non-conductive when the control signal PDLB is at a low level (negative potential VKK).

The main input/output line pair MIOT/MION is provided with a precharging and equalizing circuit comprising pMOS transistors P4 and P5 connected to differential outputs of a write amplifier 101 which is driven by the supply voltage VDD and including sources connected to the power supply VDD, drains connected to the main input/output lines MIOT and MION, respectively, and gates connected in common to a control signal MIOPREA, which controls precharging of the main input/output line pair MIOT/MION; and a pMOS transistor P6 connected across MIOT and MION and including a gate connected to the control signal MIOPREA.

The main input/output line pair MIOT/MION is connected to the input (differential input) of a main data amplifier 102 which is driven by the supply voltage VDD and to the input of the write amplifier 101. Based upon a data signal (external data information) that has been received from a data terminal (not shown), the write amplifier 101 drives the main input/output line pair MIOT/MION by an amplitude VDD/VSS. The a main data amplifier 102 differentially receives and amplifies data on the main input/output line pair MIOT/MION to output the data as external data information to a data terminal via a driver (301 in FIG. 3), etc., not shown in FIG. 5.

Provided as a bit line system is a memory cell 103, which includes an nMOS transistor N13 including a gate connected to a subword line SWL, and a capacitor Cs connected between the nMOS transistor N13 and a plate power supply; a sense amplifier (SA) 104 that is connected to the bit line pair BLT/BLN, driven by a voltage between VCC to VSS and amplifies a voltage across the bit line pair BLT/BLN; a precharging and equalizing circuit 105; and column switches N11 and N12 which, when a column-select signal CSL is at a high level, connect bit lines BLT and BLN to local input/output lines LIOT and LION, respectively. Although it imposes no restriction upon the present invention, it is assumed that the structure in FIG. 5 is that of a folded bit line in which a memory cell 103 connected to a subword line SWL is connected to a bit line BLN, and a memory cell connected to a neighboring subword line (not shown) is connected to a bit line BLT, which is the complement of BLN. It should be noted that although a plurality of bit line pairs BLT/BLN are connected to a local input/output line pair LIOT/LION, as illustrated in FIG. 3, and one is selected by a column-select signal CSL, only one bit line pair BLT/BLN connected to the local input/output line pair LIOT/LION is illustrated in FIG. 5 in order to facilitate the description. In FIG. 5, one set of the precharging and equalizing circuit (pMOS transistors P1 to P3) for precharging to supply voltage VDD and a precharging circuit (nMOS transistors N8 and N9) for precharging to HVCC is provided with respect to each local input/output line pair LIOT/LION.

Figure 6A:
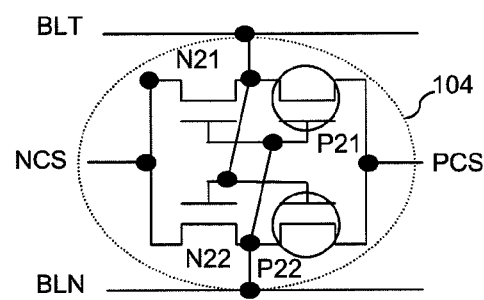
FIGS. 6A and 6B are diagrams illustrating the configurations of a sense amplifier and equalizing circuit shown in FIG. 1.

As illustrated in FIG. 6A, the sense amplifier circuit (SA) 104 connected across the bit line pair BLT/BLN includes pMOS transistors P21 and P22 including sources connected to a PCS line, and nMOS transistors N21 and N22 including sources connected to a NCS line. Drains of the pMOS transistor P21 and the nMOS transistor N21 are coupled together and connected to the BLT and to the commonly connected gates of the pMOS transistor P22 and nMOS transistor N22. Drains of the pMOS transistor P22 and the nMOS transistor N22 are coupled together and connected to the BLN and to the commonly connected gates of pMOS transistor P21 and nMOS transistor N21. The PCS line and NCS line are set to power supply potentials VCC (e.g., 1.0 V) and VSS, respectively, when the sense amplifier is activated and to ($\frac{1}{2}$)VCC, when the sense amplifier is deactivation.

Figure 6B:
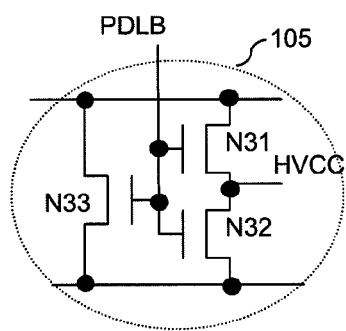

As illustrated in FIG. 6B, the precharging and equalizing circuit 105 connected to the bit line pair BLT/BLN comprises nMOS transistors N31 and N32 including sources connected to HVCC [=($\frac{1}{2}$)VCC], drains connected to BLT and BLN, respectively, and gates connected to control signal PDLB; and nMOS transistor N33 connected across the bit lines BLT and BLN and including a gate connected to the control signal PDLB. When the control signal PDLB is at a high level (VDD), the nMOS transistors N31, N32 and N33 are rendered conductive and the bit line pair BLT/BLN is precharged to [($\frac{1}{2}$)VCC] and equalized (bit-line balanced). When the control signal PDLB is at a low level (VKK), nMOS transistors N31, N32 and N33 are rendered non-conductive.

Figure 7:
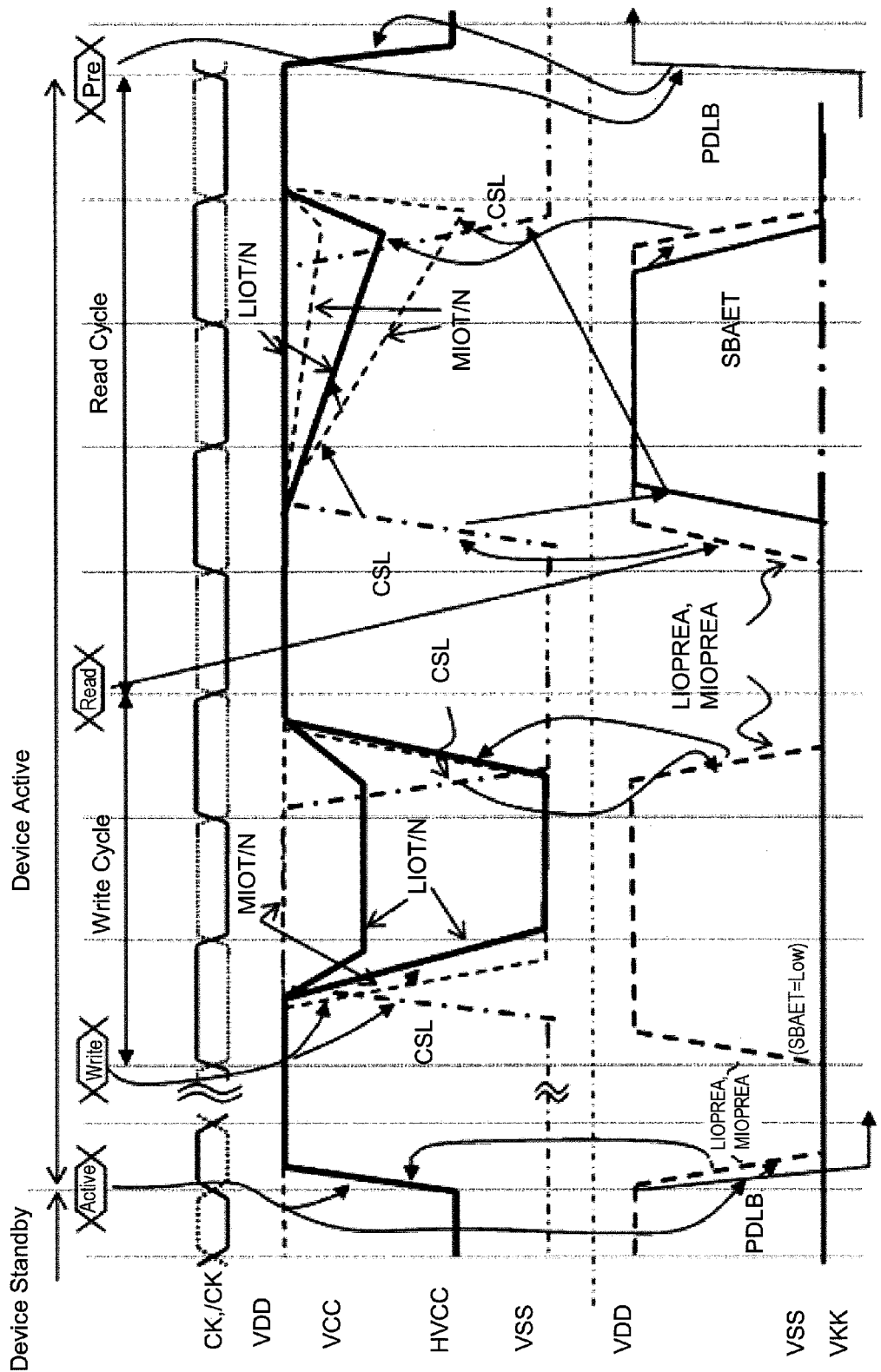
FIG. 7 is a timing waveform diagram useful in describing the operation of the first exemplary embodiment.

FIG. 7 is a diagram useful in describing the timing operation of the embodiment shown in FIGS. 5, 6A and 6B. In FIG. 7, a DRAM device state ("Device Standby", and "Device Active") and timing waveforms of complementary clocks CK and /CK, column-select signal CSL, main input/output line pair MIOT/N, local input/output line pair LIOT/N and control signals PDLB, LIOPREA, MIOPREA, SBAET are illustrated with regard the time period of the device standby state (Device Standby) and time period of the device active state (Device Active). It should be noted that in FIG. 7, the complementary main input/output line pair MIOT/MION and the local input/output line pair LIOT/LION are represented by MIOT/N, LIOT/N, respectively.

In the device standby state (Device Standby), a precharge command (Pre) is received. As a result, decoding is performed by a command decoder (not shown), the control signal PDLB (first control signal) is set to a high level (VDD), and the bit line pair BLT/BLN is precharged to HVCC (=VCC/2; first prescribed voltage) and equalized by the precharging and equalizing circuit 105. Further, since the control signal PDLB is at a high level (VDD), nMOS transistors N8 and N9 are conductive and the local input/output line pair LIOT/LION is precharged to HVCC [(½)VCC].

Figure 1:
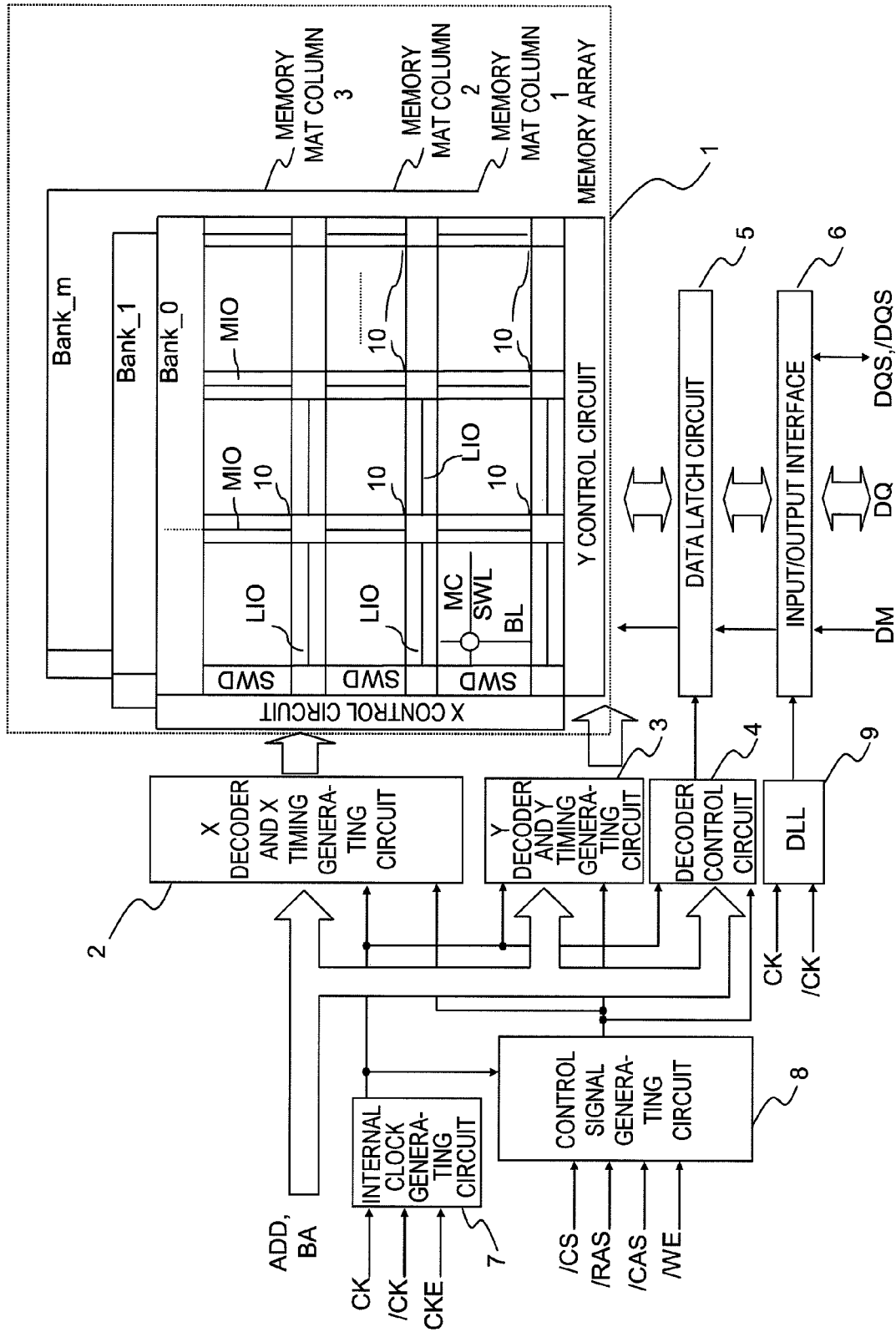
FIG. 1 is a diagram illustrating the general configuration of a DRAM device.

When a bank active (Active) is received, it is decoded by a command decoder (which is not shown and which corresponds to the control signal generating circuit 8 in FIG. 1), the DRAM device changes from a standby state to an active state and the control signal PDLB transitions from a high level (VDD) to a low level (VKK). In response to the transition of the control signal PDLB to a low level (VKK), the output signal 107 of the inverter 106 changes from a low level (VSS) to a high level (VDD). In response to this transition, nMOS transistors N1 and N2 within the sub-amplifier 100 change from the non-conductive state to the conductive state.

At this time, the control signal SBAET (second control signal) is at a low level (VSS) and therefore all of the other nMOS transistors N3 to N7 in the sub-amplifier 100 are rendered non-conductive. It should be noted that when control signal PDLB is at a low level (VKK), the nMOS transistors N8 and N9 also are rendered non-conductive and the local input/output line pair LIOT/LION is disconnected from the power supply HVCC. Further, when the bank active (Active) command is received, the control signal LIOPREA (third control signal) responds by transitioning from a high level (VDD) to a low level (VSS) in synchronization with the control signal PDLB. As a result, the pMOS transistors P1 to P3 for precharging and equalizing the local input/output line pair LIOT/LION are rendered conductive and the local input/output line pair LIOT/LION is precharged to the high level (VDD; second prescribed voltage) and equalized. Furthermore, the control signal MIOPREA (fourth control signal) transitions from a high level (VDD) to a low level (VSS) in synchronization with the control signal PDLB. As a result, the pMOS transistors P4 to P6 for precharging and equalizing the main input/output line pair MIO T/MION are rendered conductive and the main input/output line pair MIOT/MION is precharged to a high level (VDD; second prescribed voltage) and equalized.

When a write (Write) command is received and the write cycle starts, the control signal LIOPREA and the control signal MIOPREA are deactivated, the pMOS transistors P1 to P6 are rendered non-conductive, the write amplifier 101 is activated and, in accordance with the value of the entered write signal, the write amplifier 101 drives the main input/output line pair MIOT/MION complementarily by an amplitude VDD/VSS such that when one is set to a potential VDD, the other is set to a potential VSS. The output signal 107 of the inverter 106 is of a high level (VDD) and the nMOS transistors N1 and N2 are held in the conductive state. An impedance value of each of the nMOS transistors N1 and N2 assumes a low first impedance value corresponding to a saturation region of transistors. The Write amplifier 101 also drives the local input/output line pair LIOT/LION simultaneously via nMOS transistors N1 and N2 connected to the main input/output line pair MIOT/MION. It should be noted that an internal read operation by prefetch is actually performed on the LIOT/LION, and MIOT/MION in a time period from an Active command to a Write command. However, this has no direct relation to the present invention and is not described here.

In the write operation, a column-select signal CSL of the selected column transitions from a low level to a high level as a result of decoding of a column address by the column address decoder (Y decoder 2 in FIG. 1). When the column-select signal CSL is set to a high level (VDD), the column switches N11 and N12 are rendered conductive and the bit line pair BLT/BLN selected from among the plurality of bit line pairs are connected to the local input/output line pair LIOT/LION, respectively.

The low side of the local input/output line pair LIOT/LION at the time of the write operation is driven to the power supply potential VSS on the low-potential side by the write amplifier 101 in a manner similar to the low side of the main input/output line pair MIOT/MION. The potential on a high side of the local input/output line pair LIOT/LION drops to the side of the VCC level, in stead of the power supply potential VDD. In a case where the LIOT is high, however, the MIOT to which the LIOT is connected is driven by the write amplifier 101 to the supply voltage VDD, and the bit line BLT to which the LIOT is connected is driven to the voltage VCC of the PCS line by the sense amplifier 104, which is in an activated state. The drop on the high side of the local input/output line pair LIOT/LION is decided by the ratio of an amount of a current supplied from the side of the power supply VDD of the write amplifier 101 to an amount of a current supplied from the PCS line (voltage VCC) of the sense amplifier 104 in an activated state.

Figure 2:
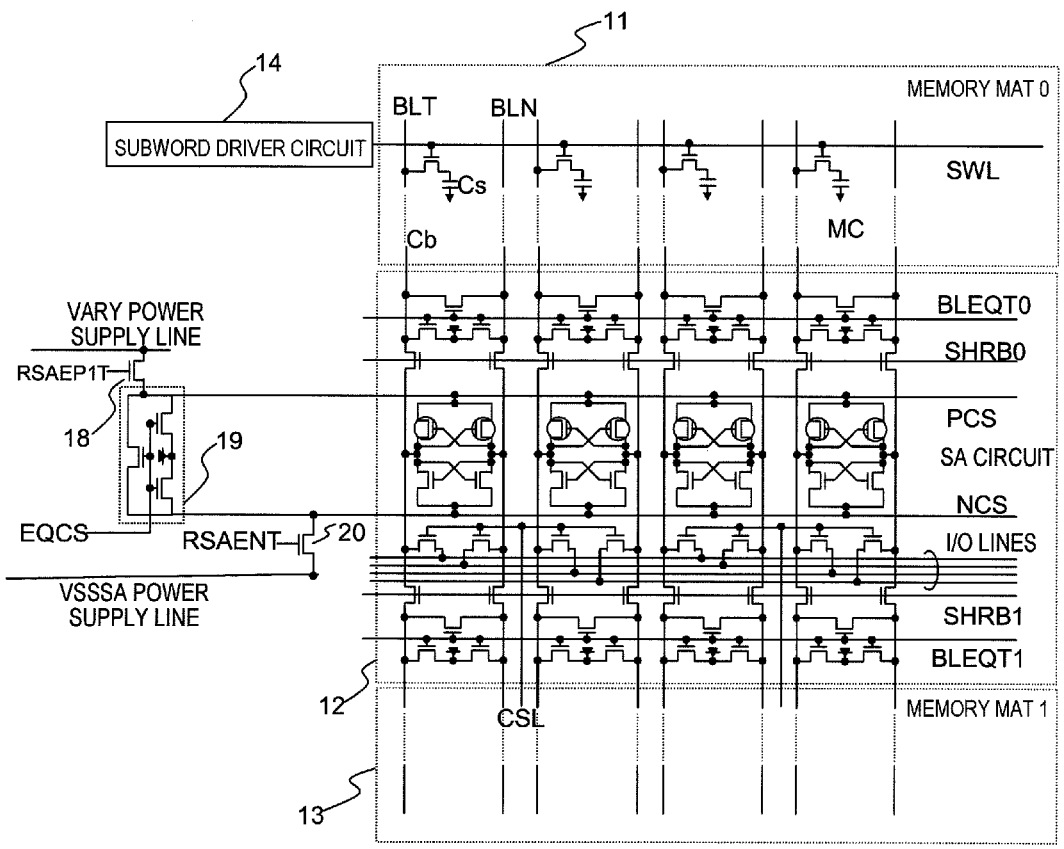
FIG. 2 is a diagram illustrating the general configuration of bit line system and a sense amplifier.

The potential of the local input/output line pair LIOT/LION is transmitted to the bit line pair BLT/BLN via a column switch pair N11/N12, the potential of bit line pair BLT/BLN is amplified to a power supply amplitude VCC/VSS by the sense amplifier 104 and data is written to the memory cell 103 connected to the selected subword line SWL (which is at a potential VPP). It should be noted that subword line SWL is placed at a high level by the subword driver circuit (14 in FIG. 2) when selected and at the low level when deselected and is driven by the amplitude between a high voltage VPP and the negative voltage VKK. VPP is a high voltage (e.g., 2.6 V) boosted by a boosting circuit (not shown) within the DRAM device.

When writing of data to the selected memory cell 103 ends and the column-select signal CSL changes from high (VDD) to low, both switches of the column switch pair N11/N12 are rendered non-conductive and the bit line pair BLT/BLN and the local input/output line pair LIOT/LION are rendered electrically non-conductive. Under these conditions, the control signal LIOPREA for precharging the local input/output line pair LIOT/LION and the control signal MIOPREA for precharging the main input/output line pair MIOT/MION both fall to the low level (VSS).

In response to the transition of the control signal LIOPREA to a low level (VSS), pMOS transistors P1, P2 and P3 are rendered conductive and the local input/output line pair LIOT/LION is precharged and equalized to the power supply potential VDD. Further, in response to the transition of the control signal MIOPREA to a low level (VSS), pMOS transistors P4, P5 and P6 are rendered conductive and the main input/output line pair MIOT/MION is precharged and equalized to the power supply potential VDD.

Next, when a READ command is received, it is decoded by a command decoder (not shown) and the control signal MIOPREA and the control signal LIOPREA are set to a high level (VDD). As a result of decoding the column address by a column address decoder (not shown), the column-select signal CSL corresponding to a selected bit line pair rises from a low level (VSS) to a high level (VDD) and the column switch pair N11/N12 is rendered conductive. At this time, the control signal SBAET is set to a high level (VDD) and nMOS transistors N5, N6, and N7 constituting a read amplifier within the sub-amplifier 100 are all rendered conductive. The selected bit line pair BLT/BLN is connected to the local input/output line pair LIOT/LION via the conductive column switch pair N11/N12 and, as a result, the bit line pair BLT/BLN and the local input/output line pair LIOT/N are driven by the sense amplifier 104, which is driven between the power supplies VCC and VSS. A high potential side of the local input/output line pair LIOT/LION is placed at a precharge potential VDD and a potential low side drops from the precharge potential. An amount of the drop and a slew rate are decided by current driving capabilities of nMOS transistors N21 and N22 (see FIG. 6) constituting the sense amplifier 104.

By way of example, in a case where the LIOT assumes a high level (VDD) and the LION is driven to a low potential side by the sense amplifier 104, the nMOS transistor N3 including its gate connected to the LIOT is rendered conductive and electric charge of the MION that has been precharged to the power supply potential VDD beforehand is discharged to the low-potential power supply VSS via the conductive nMOS transistor N6. The nMOS transistor N4 including its gate connected to the LION also is rendered conductive when the LION is on the side of the power supply potential VDD and a gate-to-source voltage VGS thereof is greater than a threshold value VTN. Electric charge of the MIOT that has been precharged to the power supply potential VDD beforehand is discharged to the side of the low-potential power supply VSS via the conductive nMOS transistor N7. However, whereas the LIOT potential (=gate potential of the nMOS transistor N3) is equal to the power supply potential VDD, the electric charge on the LION is discharged to the VSS side by the sense amplifier 104 and drops from the power supply potential VDD, and therefore a gate-to-source voltage VGS of the nMOS transistor N4 is smaller than the gate-to-source voltage VGS of the nMOS transistor N3. As a consequence, a drain current of the nMOS transistor N4 that discharges the electric charge of the MIOT to the VSS side is smaller than a drain current of the nMOS transistor N3 that discharges the electric charge of MION to the VSS side, a slew rate at which the MION falls toward the low side is greater than for the MIOT and a difference potential between MIOT and MION widens with time. Also, owing to a similar operation in a case where the LION assumes a high level (VDD) and the LIOT is driven to a low side by the sense amplifier 104, the slew rate at which MIOT falls toward the low side becomes greater than for the MION and the difference potential between the MIOT and MION is enlarged. It should be noted that the nMOS transistors N3 and N4 including gates connected to the LIOT and LION, respectively, and drains cross-connected to the MION and MIOT compose two inverting buffers each including its input connected to the output of the other via a high-resistance element (nMOS transistors N1 and N2 that operate in a triode region). These operate as differential-type sensing amplifiers in which the difference potential is widened with time. In other words, the impedance value of nMOS transistors N1 and N2 is a second impedance value higher than the first impedance value that prevails at write time.

When the read operation from memory cell 103 ends, the column-select signal CSL falls to a low level (VSS), the control signal SBAET falls to a low level (VSS), the nMOS transistors N5, N6 and N7 are rendered non-conductive and the read amplifier (N3 to N7) is set to a non-conductive state (a power supply path thereof is cut off). Further, the control signals LIOPREA and MIOPREA are both set to a low level (VSS), pMOS transistors P1, P2 and P3 are rendered conductive and the local input/output line pair LIOT/LION is precharged and equalized to the power supply potential VDD. The pMOS transistors P4, P5 and P6 are rendered conductive and the main input/output line pair MIOT/MION is precharged and equalized to the power supply potential VDD.

When a precharge command (Pre) is received following the end of the read cycle, the command is decoded by a command decoder (not shown) and the control signal PDLB transitions from a low level (VKK) to a high level (VDD). In response, the output signal 107 from the inverter 106 falls to a low level (VSS) and the nMOS transistors M1 and N2 in the sub-amplifier 100 are rendered non-conductive. Further, the nMOS transistors N8 and N9, which receive the control signal PDLB at their gates, both are rendered conductive and the local input/output line pair LIOT/LION is precharged to HVCC. Further, as a result of the transition to a high level (VDD) of the control signal PDLB, the precharging and equalizing circuit 105 precharges the bit line pair BLT/BLN to HVCC.

In the related art, conduction and non-conduction of the transfer gate (nMOS transistors N1 and N2) is controlled using a write-related control signal that is set to a high level only at a time of the write operation, as shown in FIG. 4A. By contrast, in accordance with the present invention, use is made of a signal, which is obtained by inverting a signal (bit line balance signal) that controls the precharging and equalizing of the bit line pair BLT/BLN, as the signal for controlling conduction and non-conduction of the nMOS transistors N1 and N2, and the signal is set to a high level beforehand in an active time period. In read operation, there is a dead zone equivalent to a threshold value (VTN) of nMOS transistors N1 and N2. The local input/output line pair LIOT/LION, which is rendered electrically conductive at the first impedance value at write time, operates at a read time without a load of the main input/output line pair MIOT/MION being visible or imposed, owing to the switches [transfer gates (nMOS transistors N1 and N2)] which are rendered electrically conductive at a second impedance value higher than the first impedance value. As a result, a large delay does not occur in the local input/output line pair LIOT/LION. Further, when the local input/output line pair LIOT/LION develops a certain degree of difference potential, a difference potential develops in the main input/output line pair MIOT/MION as well. The result, therefore, is that the read operation is carried out normally without any difference from the related art. In accordance with the present invention, it is no longer necessary to control a write-related control signal, as a result of which control in the write cycle can be facilitated. In other words, the number of necessary control signals is reduced and control is simplified, thereby making it possible to reduce power consumption.

Second Exemplary Embodiment

Figure 8:
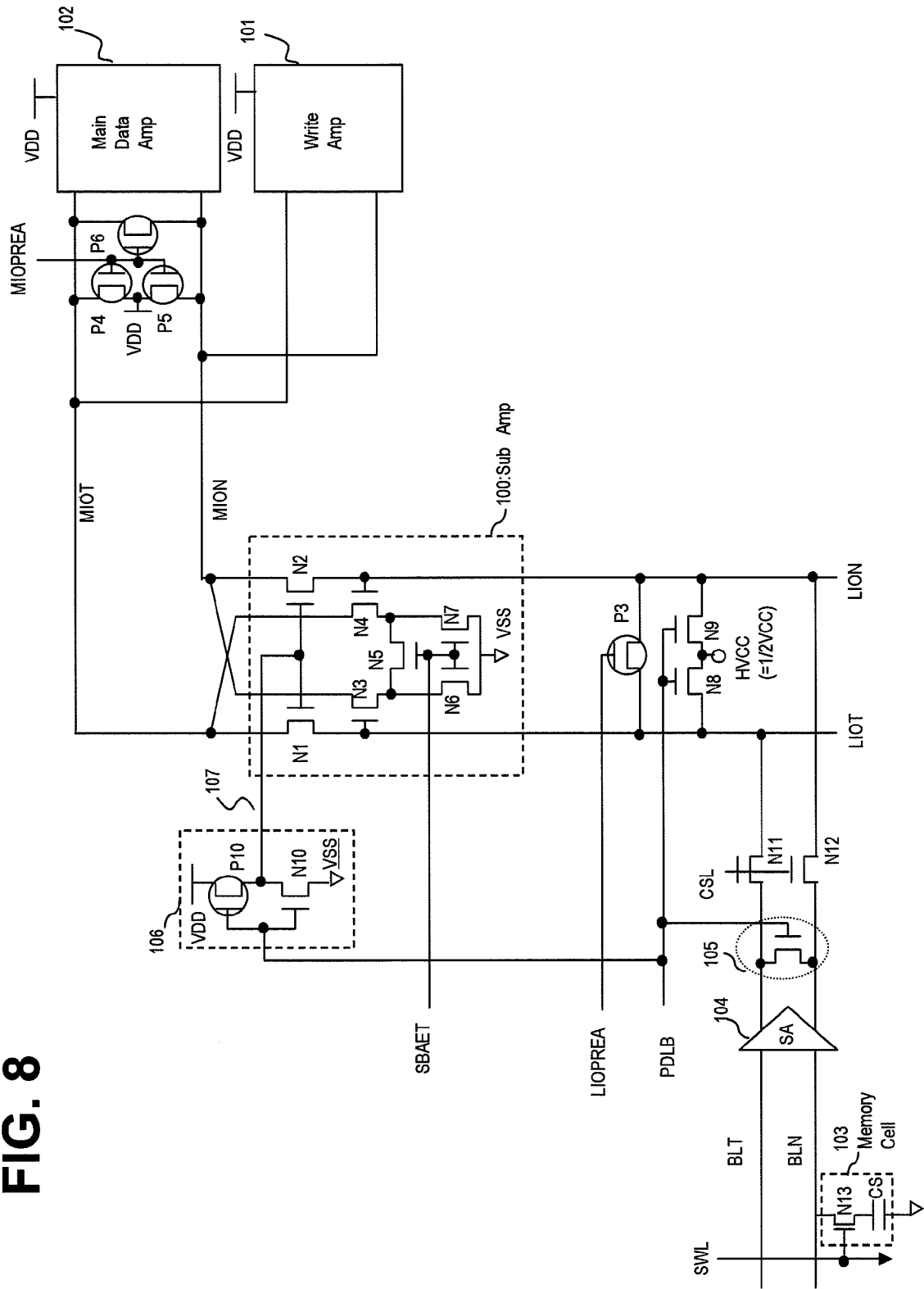
FIG. 8 is a diagram illustrating the configuration of a second exemplary embodiment of the present invention.

A second exemplary embodiment of the present invention will be described next. FIG. 8 is a diagram illustrating the configuration of the second exemplary embodiment of the present invention. As shown in FIG. 8, this embodiment is such that pMOS transistors P1 and P2, which compose the circuit that precharges local input/output line pair LIOT/LION to a power supply potential VDD are deleted from the arrangement of FIG. 5, leaving the equalizing circuit (pMOS transistor P3) of the local input/output line pair LIOT/LION. FIG. 8 is identical with FIG. 5 in other respects.

The arrangement of this embodiment is such that in a case where the control signal LIOPREA is set to a low level (VSS) and the local input/output line pair LIOT/LION is precharged in the write and read cycles, the precharging voltage is set from the local input/output line pair LIOT/LION via the transfer gate (nMOS transistors N1 and N2).

The main input/output line pair MIOT/MION is precharged to the power supply potential VDD when the control signal MIOPREA is at a low level (VSS). At this time, the control signal PDLB is placed at a low level (VKK), the output signal 107 of the inverter 106 goes to a high level (VDD) and the nMOS transistors N1 and N2 are rendered conductive. As a consequence, the local input/output line pair LIOT/LION is precharged to VDD-VTN, which is obtained by subtracting a threshold-value voltage VTN of the nMOS transistors N1 and N2 from the precharging potential VDD of the main input/output line pair MIOT/MION. When the control signal MIOPREA is at a low level (VSS), the control signal LIOPREA also assumes a low level (VSS), the pMOS transistor P3 is rendered conductive and the local input/output line pair LIOT/LION is equalized. In accordance with this embodiment, the precharging potential of the local input/output line pair LIOT/LION is lowered in comparison with the first exemplary embodiment, thereby making it possible to lower power consumption.

Figure 9:
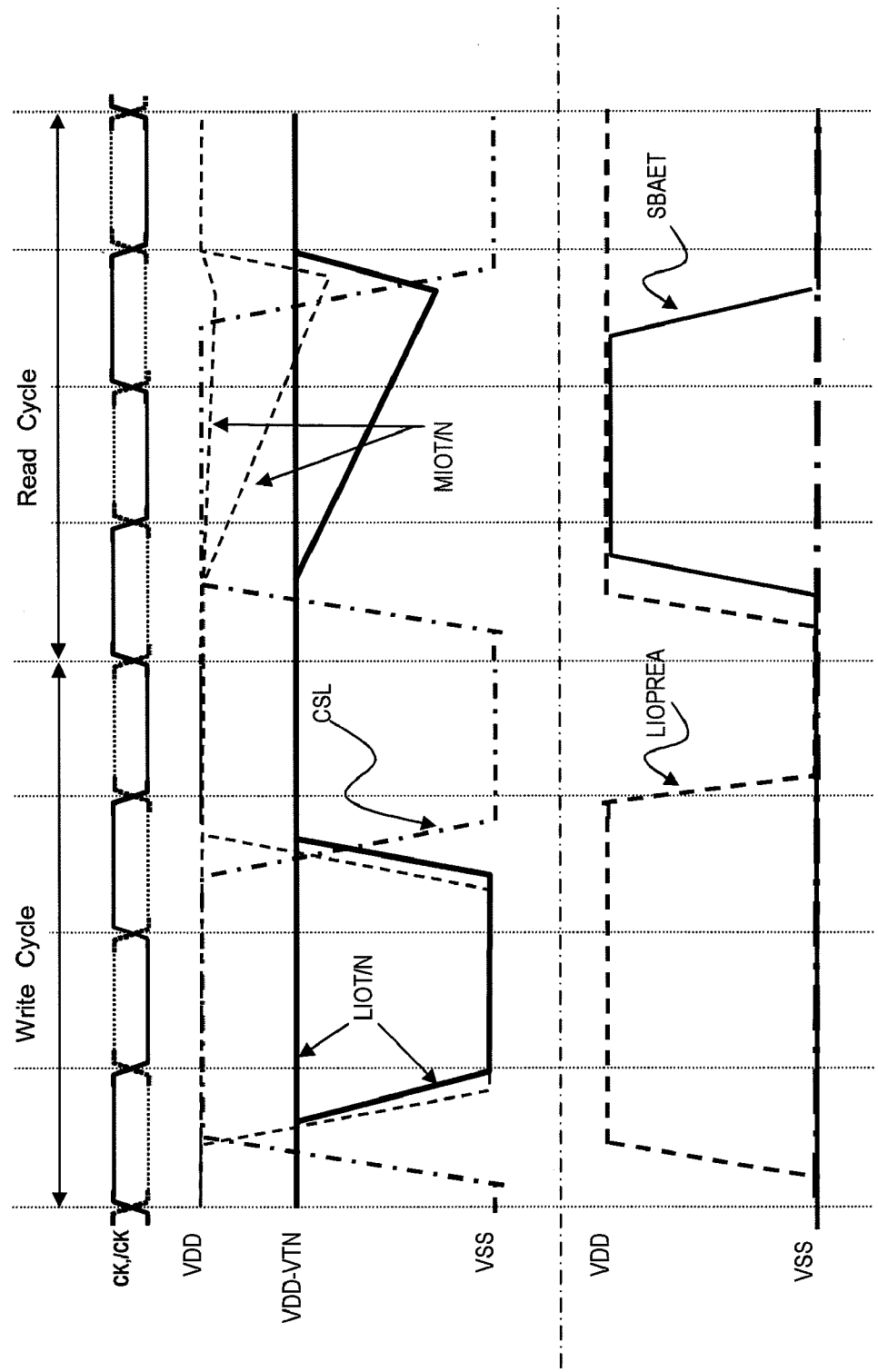
FIG. 9 is a timing waveform diagram useful in describing the operation of the second exemplary embodiment.

FIG. 9 is a timing waveform diagram useful in describing the operation of the second exemplary embodiment shown in FIG. 8. FIG. 9 illustrates four clock cycles of the write cycle after the reception of the write (Write) command following reception of the bank active (Active) command of FIG. 7, and four clock cycles of the read cycle of FIG. 7. In FIG. 9, the signal waveforms of control signals PDLB and MIOPREA are not illustrated but they make transitions to the same levels at the same timings as those shown in FIG. 7.

In response to the bank active (Active) command, the control signal PDLB transitions from high (VDD) to low (VKK), the nMOS transistors N1 and N2 are rendered conductive, the nMOS transistors N8 and N9 are rendered non-conductive and the local input/output line pair LIOT/LION that has been precharged to HVCC [(½)VCC] is precharged to a potential VDD-VTN, which is lower than the precharging voltage VDD of the main input/output line pair MIOT/MION by an amount of the threshold-value voltage VTN.

When the write (Write) command is received, the main input/output line pair MIOT/MION is driven to the amplitude VDD/VSS by the write amplifier 101. The nMOS transistors N1 and N2 are rendered conductive and the local input/output line pair LIOT/LION is driven by the write amplifier 101. A potential on a high side of the local input/output line pair LIOT/LION is set to VDD-VTN and a potential on a low side thereof is set to potential VSS.

When writing of data to the memory cell 103 ends and the column-select signal CSL falls to a low level (VSS), the control signals MIOPREA and LIOPREA both fall to a low level (VSS). When the control signal MIOPREA is at a low level, the main input/output line pair MIOT/MION is precharged and equalized to the power supply potential VDD. When the control signal LIOPREA is low, the pMOS transistor P3 is rendered conductive and the local input/output line pair LIOT/LION is equalized to VDD-VTN, which is obtained by subtracting a threshold-value voltage VTN of nMOS transistors N1 and N2 from precharging voltage VDD of the main input/output line pair MIOT/MION.

When a read (Read) command is received and data is read from the memory cell 103, the column-select signal CSL is set to a high level (VDD) and the sense amplifier 104 of the bit line pair BLT/BLN connected to the local input/output line pair LIOT/LION drives the local input/output line pair LIOT/LION from a potential VDD-VTN in accordance with the value of data read from the memory cell 103. The high side is made potential VDD-VTN and the low side is driven to the VSS side by nMOS transistors N21 and N22 of the sense amplifier 104. In response to a received high pulse (VDD) of the control signal SBAET, nMOS transistors N5 to N7 conduct, the read amplifier (nMOS transistors N3 to N7) is activated and nMOS transistors N3 and N4, which receive the potentials of the local input/output line pair LIOT/LION at their respective gates, drive the cross-connected main input/output lines MION and MIOT, respectively. For example, when a potential on LIOT is VDD-VTN, a gate-to-source voltage of the nMOS transistor N3 becomes larger than its threshold-value voltage VTN and electric charge on MION, which has been precharged to the power supply potential VDD, is discharged to the low-potential power supply VSS. On the other hand, LION is discharged from the potential VDD-VTN to the VSS side by the sense amplifier 104, the gate-to-source voltage of the nMOS transistor N4 is lowered by an amount of the threshold-value voltage VTN and the potential on MIOT remains as is at approximately VDD. The main data amplifier 102 amplifies the difference potential across the main input/output line pair MIOT/MION and outputs the data externally via the driver (301 in FIG. 3).

Third Exemplary Embodiment

Figure 10:
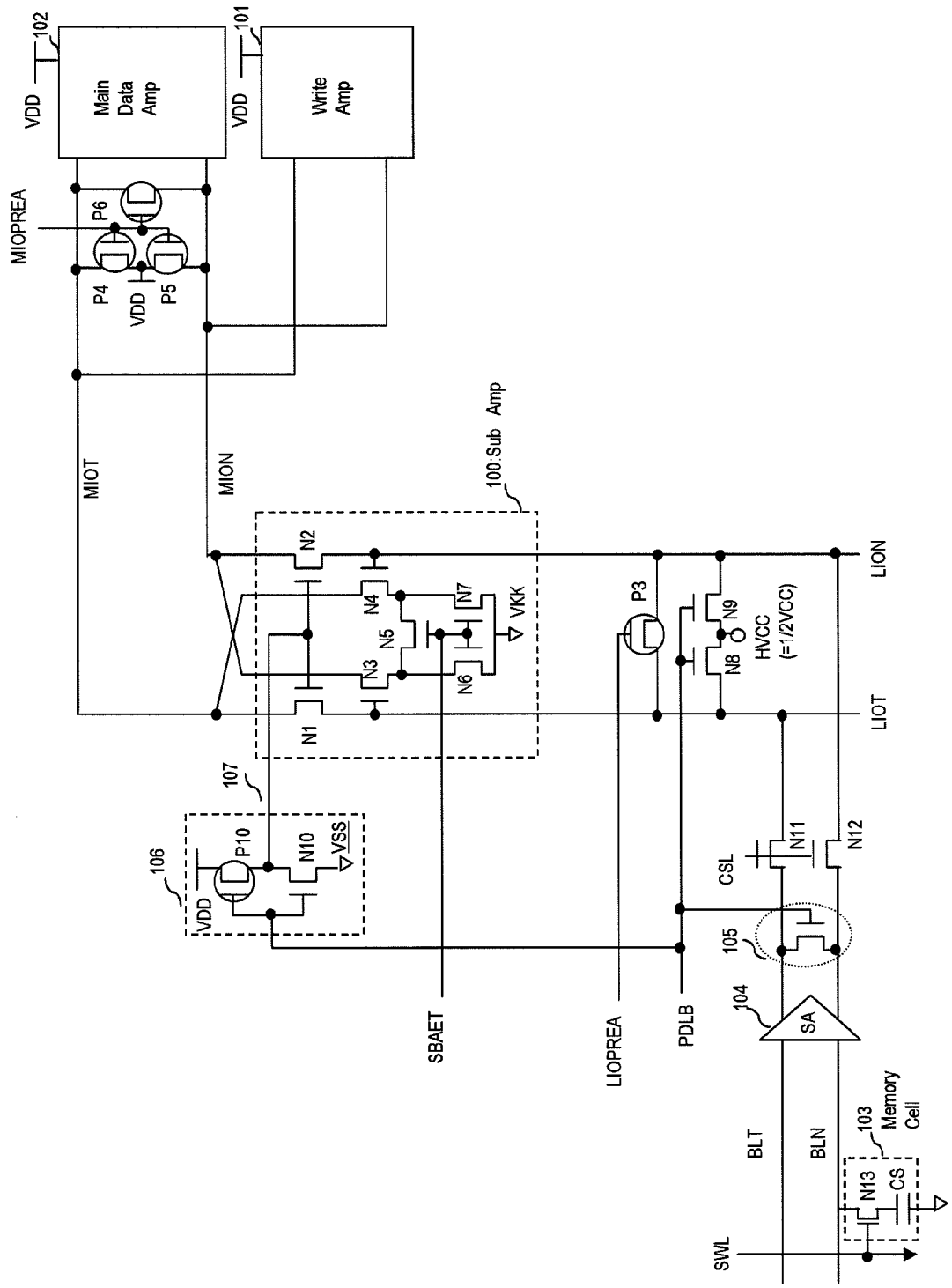
FIG. 10 is a diagram illustrating the configuration of a third exemplary embodiment of the present invention.

A third exemplary embodiment of the present invention will be described next. FIG. 10 is a diagram illustrating the configuration of the third exemplary embodiment of the present invention. As shown in FIG. 10, this embodiment is such that the low-potential power supply of the read amplifier (nMOS transistors N3 to N7) of the sub-amplifier 100 in the arrangement of the second exemplary embodiment of FIG. 8 is made a negative potential VKK from VSS and the operating voltage of the read amplifier is between VDD and VKK. That is, the coupled sources of the nMOS transistors N6 and N7 are connected to VKK. FIG. 10 is identical with FIG. 8 in other respects. The differences between this embodiment and the second exemplary embodiment will be described below.

In read operation, the control signal SBAET is set to a high level (VDD) and the nMOS transistors N5 to N7 of the sub-amplifier 100 are rendered conductive. At this time, the common source potential of nMOS transistors N3 and N4 is lowered below that of the second exemplary embodiment, thereby widening the gate-to-source voltage VGS of nMOS transistors N3 and N4 and making a drain current, which discharges electric charge of the main input/output line pair MIOT/MION to the VKK side, larger than that of the second exemplary embodiment. As is well known, the drain current of an nMOS transistor is proportional to the square of (VGS-VTN) in the saturation region. As a result, in a case where the precharging potential of the local input/output line pair LIOT/LION is lowered to VDD-VTN, a decline in the operating speed of the read amplifier (nMOS transistors N3 to N7) of the sub-amplifier 100 is prevented.

Figure 11:
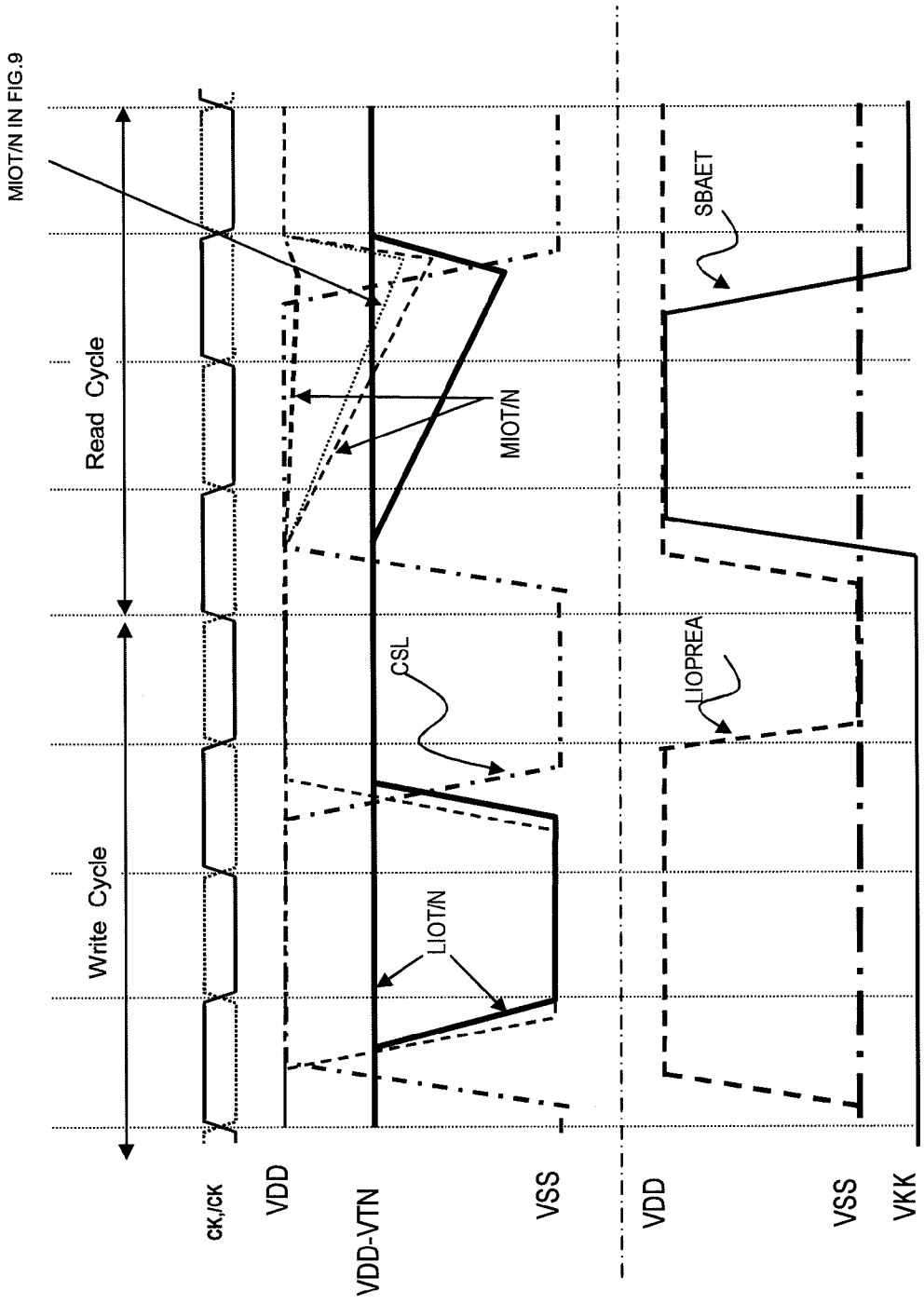
FIG. 11 is a timing waveform diagram useful in describing the operation of the third exemplary embodiment.

FIG. 11 is a timing waveform diagram useful in describing the operation of the third exemplary embodiment shown in FIG. 10. FIG. 11 illustrates four clock cycles of the write cycle after the reception of the write command following the reception of the bank active (Active) command of FIG. 7, and four clock cycles of the read cycle of FIG. 7. In FIG. 11, the signal waveforms of the control signals PDLB and MIO-PREA are not illustrated but they make transitions to the same levels at the same timings as those shown in FIG. 7. It should be noted that the write cycle in FIG. 11 is the same as that write cycle shown in FIG. 9 and need not be described again.

When the read command is received and data is read from the memory cell 103, column-select signal CSL attains the high level (VDD) and sense amplifier 104 of bit line pair BLT/BLN connected to local input/output line pair LIOT/LION drives local input/output line pair LIOT/LION from potential VDD-VTN in accordance with the value of data read out of memory cell 103. The high side is made potential VDD-VTN and the low side is driven to the VSS side by nMOS transistors N21 and N22 of sense amplifier 104. In response to the received high pulse (VDD) of the control signal SBAET, nMOS transistors N5 to N7 are rendered conductive, the read amplifier (nMOS transistors N3 to N7) is activated and the nMOS transistors N3 and N4, which receive the potentials of local input/output line pair LIOT/LION at their respective gates, drive the cross-connected main input/output lines MION and MIOT, respectively. For example, when the potential on LIOT is VDD-VTN, the gate-to-source voltage VGS of nMOS transistor N3 becomes larger than threshold-value voltage VTN and the electric charge on MION, which has been precharged to power supply potential VDD, is pulled out to the side of low-potential power supply VKK. On the other hand, the electric charge on LION is pulled to the VSS side by sense amplifier 104, the gate-to-source voltage of nMOS transistor N4 is made the threshold-value voltage VTN and the potential on MIOT declines slightly from VDD. The main data amplifier 102 amplifies the difference potential across the main input/output line pair MIOT/MION and outputs the data externally via the driver (301 in FIG. 3). As illustrated in FIG. 11, in this embodiment the slew rate at which MIOT/MION falls is greater than the slew rate (FIG. 9) at which MIOT/MION falls in the second exemplary embodiment.

The effects of the embodiments will now be described.

Power consumption and chip area can be reduced by reducing the number of control signals.

Further, in FIG. 1, in a case where a write-related control signal generated by the control signal generating circuit is supplied to each switch at a timing from the X, Y timing generating circuits in order to control the transfer gate (N1, N2 of FIG. 4) within switch 10 provided at the intersection of the LIO line and MIO line, it is necessary to pass the write-related control signal through the memory array. By contrast, in accordance with the present invention, a signal for controlling the transfer gate (N1, N2 of FIG. 4) within switch 10 at the intersection of the LIO line and MIO line is generated based upon a precharge control signal, which is an existing X-system control signal. This means that it is no longer necessary to pass a special-purpose write-related control signal through the memory array. Further, with the related art, the write-related control signal wiring that passes through the memory array is charged and discharged every read/write cycle. In accordance with the present invention, however, this is unnecessary. Thus, in accordance with the present invention, by reducing a load (parasitic capacitance) of a wiring (interconnect) that passes through the memory array, the consumption current that charges and discharges the wiring every read/write cycle can be reduced.

In accordance with the present invention, a scheme for controlling conduction of the switch between the MIO and LIO lines using the write-related control signal is not adopted. Rather, switch conduction is controlled using a bit-line precharging signal, which is the X-system control signal. As a result, it is unnecessary to perform a time adjustment for preventing skew between operation timing of the write amplifier and operation timing of the switch between the MIO and LIO lines.

The basic technical idea of this application is not limited to the foregoing. For example, in the embodiments, the invention is applied to a DRAM. However, basic technical ideas or features of this application are not limited to a DRAM. For example, the invention is applicable to an SRAM (Static RAM) or to other synchronous memories. Furthermore, the forms of the circuits of the sense amplifier, write amplifier, each equalizing circuit provided in every layer and sub-amplifier accompanying switches between layers, as well as the circuits for generating the control signals, are not limited to the forms of the circuits disclosed in the embodiments. Further, the voltage control values of each corresponding layer controlled by each equalizing circuit are not limited to those disclosed in the embodiments. For example, equalization of the layer on the secondary side may be performed on the low-potential side or at an intermediate potential between the high-potential side potential and low-potential side potential and not only at VDD on the high-potential side disclosed in the embodiments. The amount of voltage amplitude of the hierarchical bus at a time of a read operation is a matter of design; various values can be designed. The read method may be a well-known read method using loading. This would readily be understood by those skilled in the art in view of the basic technical idea of this application.

The basic technical ideas of the present invention are also applicable to semiconductor devices that are not limited to special-purpose storage devices. For example, the present invention is applicable to all semiconductor devices equipped with a memory function, such as a CPU (Central Processing Unit), MCU (Micro-Control Unit), DSP (Digital Signal Processor), ASIC (Application Specific Integrated Circuit) and ASSP (Application Specific Standard Circuit). An SOC (System On Chip), MCP (MultiChip Package) and POP (Package On Package), etc., can be mentioned as examples of forms of semiconductor device products to which the present invention has been applied. The present invention is applicable to semiconductor devices including these product forms and package forms.

The basic technical idea of the present invention is not limited to a hierarchical bus used in applications for amplifying information in a memory cell. The hierarchical bus may be one used in signal processing of logic such as an ASIC or in data signal processing such as DSP. In other words, it goes without saying that the claims of this application are not limited to a hierarchical bus of a semiconductor device. In the embodiments, the invention is applicable to a semiconductor device such as an SOC, MCP or POP.

It will suffice if the transistors are FETs (Field-Effect Transistors), and the present invention is applicable to various FETs, such as an MIS (Metal-Insulator Semiconductor) or TFT (Thin-Film Transistor), in addition to an MOS (Metal-Oxide Semiconductor). The transistors may be bipolar-type transistors. The transistors may be other than FETs.

Furthermore, a typical example of an nMOS transistor (N-channel MOS transistor) is a transistor of first conductivity type, and a typical example of a pMOS transistor (P-channel MOS transistor) is a transistor of second conductivity type.

Further, multifarious combinations and selections of the various disclosed elements are possible within the scope of the claims of the present invention. That is, it goes without saying that the invention covers various modifications and changes that would be obvious to those skilled in the art in accordance with the full disclosure, inclusive of the scope of the claims, and the technical idea.

What is claimed is:

1. A semiconductor device comprising:
   first to third data lines, each of which transfers data bidirectionally;
   a first switch that controls connection between the first and second data lines;
   a second switch that is connected between the second and third data lines;
   a first amplifier that is connected to the first data line and that amplifies data information on the first data line and holds amplified data information;
   a second amplifier that is connected to the second data line and that drives the third data line in accordance with data information on the second data line;
   a third amplifier that is connected to the third data line and that drives the third data line in accordance with external data information externally supplied;
   a fourth amplifier that is connected to the third data line and that receives data information transferred from the second amplifier to the third data line and outputs the data information as external data information; and
   a switch control circuit that generating a signal that controls the second switch, based upon a first control signal that controls precharging of the first data line.

2. The device according to claim 1, wherein the first control signal is activated to perform precharging of the first data line in a standby mode, in which the device is not externally accessed, and
   the first control signal is deactivated at access time, which includes both a read mode in which data is transferred from the first data line to the third data line, and a write mode in which data is transferred from the third data line to the first data line.

3. The device according to claim 2, wherein the switch control circuit renders the second switch electrically non-conductive, when the precharging of the first data line is carried out, responsive to activation of the first control signal, and
   renders the second switch electrically conductive, when the precharging of the first data line is not carried out, responsive to deactivation of the first control signal.

4. The device according to claim 2, wherein the switch control circuit supplies a signal, which is obtained by inverting the first control signal, to the second switch, as the signal controlling the second switch.

5. The device according to claim 2, wherein the switch control circuit converts an amplitude voltage of the first control signal to a different amplitude voltage, and supplies the first control signal with an converted amplitude to the second switch as the signal controlling the second switch.

6. The device according to claim 2, wherein a low-potential side supply voltage of the second amplifier assumes a negative potential lower than a low-potential side supply voltage of the fourth amplifier.

7. The device according to claim 2, wherein the second data line comprises a second data line pair transferring a signal as a complementary signal pair, and
   the third data line comprises a third data line pair transferring a signal as a complementary signal pair, wherein
   the second switch comprises
   a second switch pair connected between the second data line pair and the third data line pair, the second switch pair including
   first and second transistors including first terminals connected to respective data lines of the third data line pair, second terminals connected to respective data lines of the second data line pair, and control terminals connected in common to an output of the switch control circuit.

8. The device according to claim 7, wherein the second amplifier includes:
   third and fourth transistors including control terminals connected to data line of the second data line pair, respectively, and first terminals mutually cross-connected to data line of the third data line pair;
   a fifth transistor including first and second terminals connected to the second terminals of the third and fourth transistors; and
   sixth and seventh transistors respectively connected between second terminals of the third and fourth transistors and a low-potential-side power supply, wherein the fifth to seventh transistors includes control terminals connected to a second control signal and are controlled in common to be electrically conductive or non-conductive.

9. The device according to claim 7, wherein the first data line comprises a complementary first data line pair, at least one of the data lines thereof being connected to a memory cell, with one signal being represented by complementary signals,
   the first amplifier comprises a sense amplifier connected to the first data line pair, and
   the first switch comprises
   a column switch that controls connection between the first data line pair and the second data line pair, responsive to a column select signal supplied thereto and corresponding to an address signal externally supplied,
   the device further comprising
   a circuit that is connected across the first data line pair and that performs precharging and equalizing of the first data line pair to a first prescribed voltage, responsive to the first control signal.

10. The device according to claim 7, further comprising a precharging and equalizing circuit that is connected across the second data line pair, and that performs precharging and equalizing of the second data line pair to a second prescribed voltage, responsive to a third control signal.

11. The device according to claim 7, wherein the second data line pair is precharged to a voltage, which is lowered by a prescribed voltage from a precharging voltage of the third data line pair, responsive to a third control signal.

12. The device according to claim 11, further comprising:
   a first precharging and equalizing circuit that is connected across the second data line pair and that performs precharging and equalizing of the second data line pair to a second prescribed voltage, responsive to the third control signal; and
   a second precharging and equalizing circuit that is connected across the third data line pair and that performs precharging and equalizing of the third data line pair to the second prescribed voltage, responsive to a fourth control signal, wherein the second data line pair is precharged to a voltage, which is lowered by the prescribed voltage from the second prescribed voltage, via the first and second transistors, which are rendered electrically conductive, from the third data line pair precharged and equalized to the second prescribed voltage responsive to the fourth control signal.

13. The device according to claim 7, wherein the second switch pair controlled to be electrically conductive in the write mode to transfer the external data information, operates also in the read mode.

14. The device according to claim 13, wherein when the read mode is in effect, the second switch operates at a second impedance value higher than a first impedance value which prevails when the write mode is in effect.

15. A semiconductor device comprising:
   a primary-side data line pair, to which a memory cell is connected and which transfers data bidirectionally;
   a primary-side first amplifier that is connected to the primary-side data line pair and that amplifies data information on the primary-side data line pair and holds the data information amplified;
   a primary-side second amplifier that is connected to the primary-side data line pair and that drives a secondary-side data line pair in accordance with the data information on the primary-side data line pair;
   a secondary-side data line pair that is connected to the primary-side data line pair via a switch and that receives external data information externally supplied;
   a secondary-side amplifier connected to the secondary-side data line pair; and
   a switch control circuit that controls the switch, wherein
   in a write mode in which externally input data is written to a memory cell, the secondary-side amplifier drives the secondary-side data line pair in accordance with the external data information,
   the data information on the secondary-side data line pair is transferred to the primary-side data line pair via the switch, which is rendered electrically conductive, and
   internal data information held by the primary-side first amplifier is rewritten by the external data information, and
   in a read mode in which data is read from the memory cell, the primary-side first amplifier drives the primary-side data line pair in accordance with information in the memory cell,
   the data information on the primary-side data line pair is transferred to the secondary-side data line pair via the primary-side second amplifier, and
   the secondary-side amplifier externally outputs internal data information held by the memory cell on the secondary-side data line pair, and wherein
   the switch control circuit generates, irrespective of a write mode or read mode, a signal that controls the switch, based upon a first control signal that controls precharging of the primary-side data line pair in a standby mode, in which the device is not externally accessed.

16. The device according to claim 15, wherein the switch control circuit renders the switch electrically non-conductive when precharging of the primary-side data line pair is performed and electrically conductive when precharging of the primary-side data line pair is not performed.

17. The device according to claim 15, wherein the primary-side data line pair includes:
   a bit line pair to which the primary-side first amplifier is connected; and
   a local input/output line pair connected via a column switch controlled by a column-select signal corresponding to an address externally input to the bit line pair, and
   the secondary-side data line pair includes one main input/output line pair connected via a plurality of the switches corresponding to respective ones of a plurality of the local input/output line pairs.

18. The device according to claim 15, wherein the switch is rendered electrically conductive at a first impedance value in the write mode and is rendered electrically conductive at a second impedance value higher than the first impedance value in the read mode.

19. The device according to claim 17, wherein an equalize voltage of the local input/output line pair is lower than an equalize voltage of the main input/output line pair by an amount equivalent to a threshold value of a transistor constituting the switch.

20. The device according to claim 18, wherein a low-potential side of a driving power supply voltage of the primary-side second amplifier is a negative potential lower than a low-potential side of a driving power supply voltage of the secondary-side amplifier.

* * * * *